United States Patent [19]

Brown et al.

[11] Patent Number: 4,499,648

[45] Date of Patent: Feb. 19, 1985

[54] AUTOMATIC WIRING APPARATUS WITH ROTATABLE INSERTION TOOLING

[75] Inventors: Christopher K. Brown, Camp Hill; Lex D. Kensinger, Annville; William R. Over; Donald A. Wion, both of Harrisburg, all of Pa.

[73] Assignee: AMP Incorporated, Harrisburg, Pa.

[21] Appl. No.: 426,455

[22] Filed: Sep. 29, 1982

[51] Int. Cl.³ ............................................. B23P 23/00
[52] U.S. Cl. ................................ 29/564.2; 29/566.3; 29/850; 140/93 R
[58] Field of Search .............. 29/850, 745, 753, 564.2, 29/564.3, 861, 566.1, 566.3; 140/93 R; 339/98

[56] References Cited

U.S. PATENT DOCUMENTS

| | | | |
|---|---|---|---|
| 3,186,077 | 6/1965 | Vickery, Jr. | 29/203 |
| 3,231,967 | 2/1966 | Kreinberg, et al. | 29/203 |
| 3,372,475 | 3/1968 | Vickert, Jr. | 29/861 |
| 3,435,858 | 4/1969 | Taysom et al. | 140/93 R X |
| 3,840,962 | 10/1974 | Coller | 29/203 B |
| 3,960,309 | 6/1976 | Hazel | 140/93 R X |
| 4,031,612 | 6/1977 | Nicolas | 29/850 |
| 4,066,317 | 1/1978 | Bierenfeld et al. | 339/98 X |
| 4,177,549 | 12/1979 | Mori et al. | 29/564.2 |
| 4,331,182 | 5/1982 | Sprenkle | 140/93 R |
| 4,351,468 | 9/1982 | Floury et al. | 228/4.5 |
| 4,387,509 | 1/1983 | Docheletter | 29/850 |
| 4,437,603 | 3/1984 | Kobayashi et al. | 29/850 X |

Primary Examiner—William R. Briggs
Assistant Examiner—Glenn L. Webb
Attorney, Agent, or Firm—F. Brice Faller

[57] ABSTRACT

Machine for interconnecting wire-in-slot type terminals in connectors mounted on a panel board utilizes a wire feed roll, rotatable insertion tooling, and an X-Y table. Wire is fed vertically through a rotation housing past wire inserters mounted above an aperture in a rotary plate. Wires are positioned for termination by wire feeding and movement of the X-Y table on which the panel board is mounted. Independently pivotable idler wheels cooperate with the feed roll to engage one or two wires. Insertion is effected by downward movement of the rotation housing which drives the inserters through the aperture in the rotary plate. The rotation housing is moved by pivoting a yoke with a variable pivot point to change limits of travel and therefore insertion depth. The plate, inserters, and rotation housing may be rotated to four orthogonal orientations to insert wires in terminals having like orientations. Through-wire type inserters may be shifted laterally on the rotary plate by solenoids so that wire cut-off type inserters will be poised above the aperture in the rotary plate, making the apparatus capable of threading a wire through several connectors prior to cutting it.

10 Claims, 20 Drawing Figures

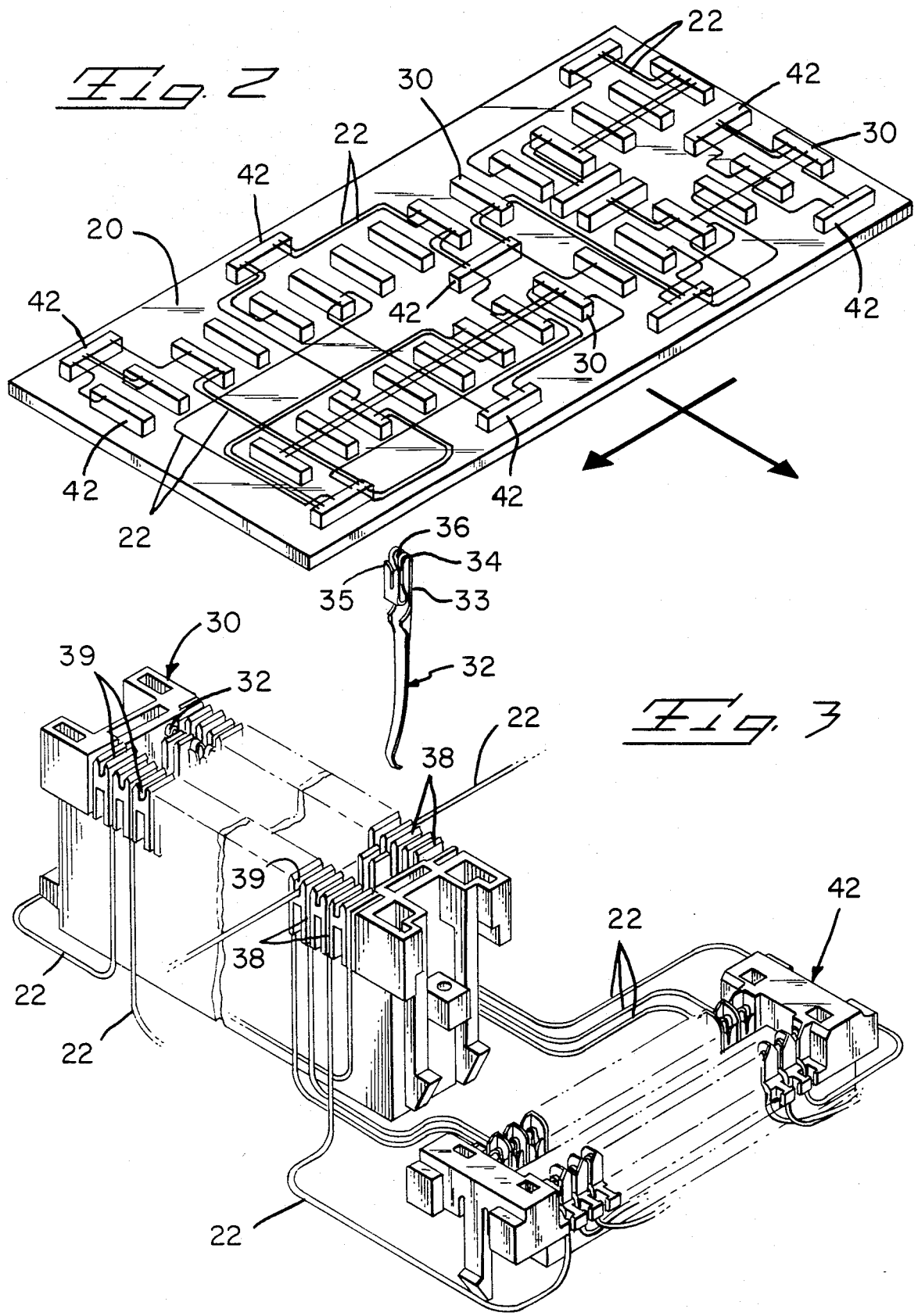

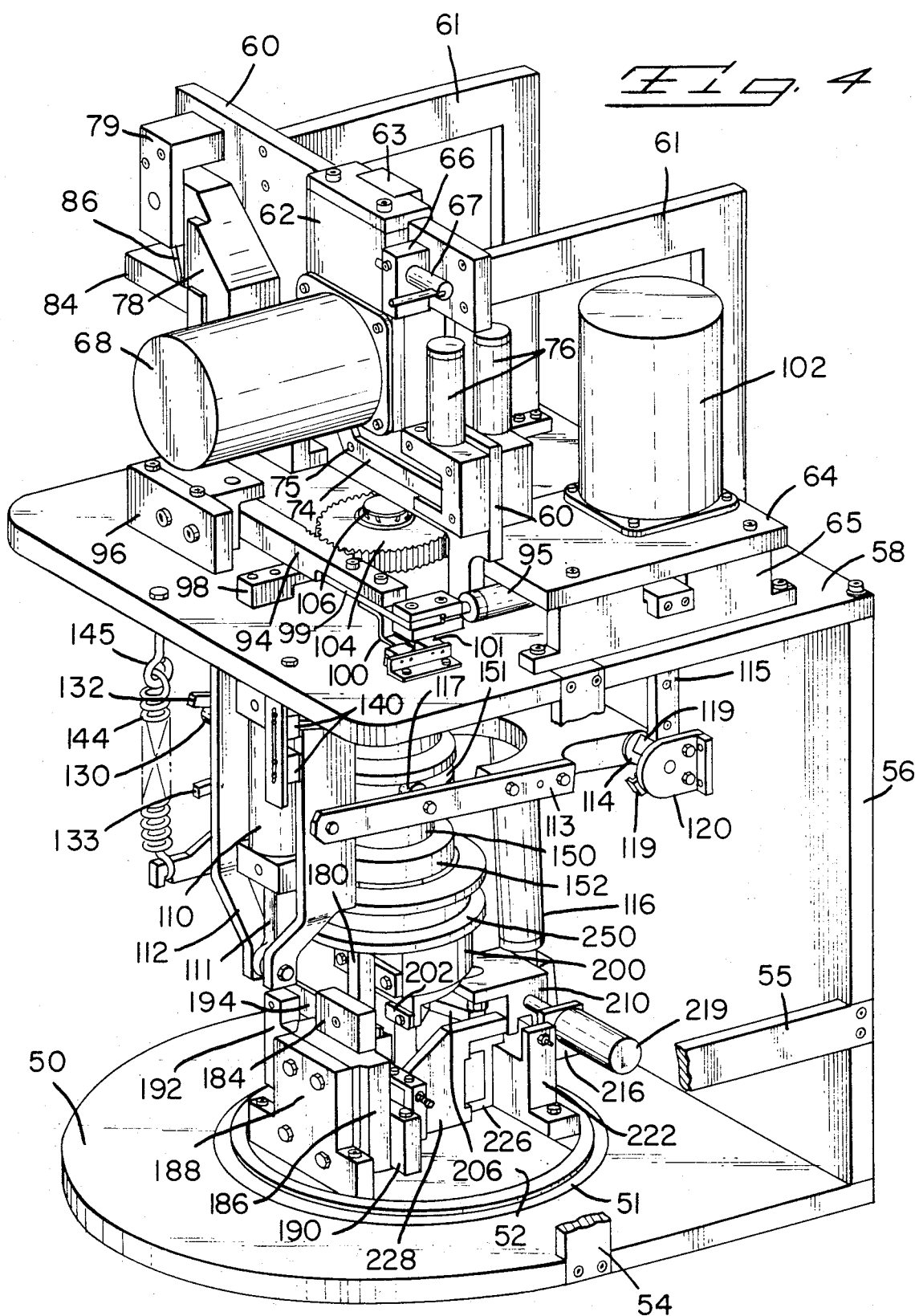

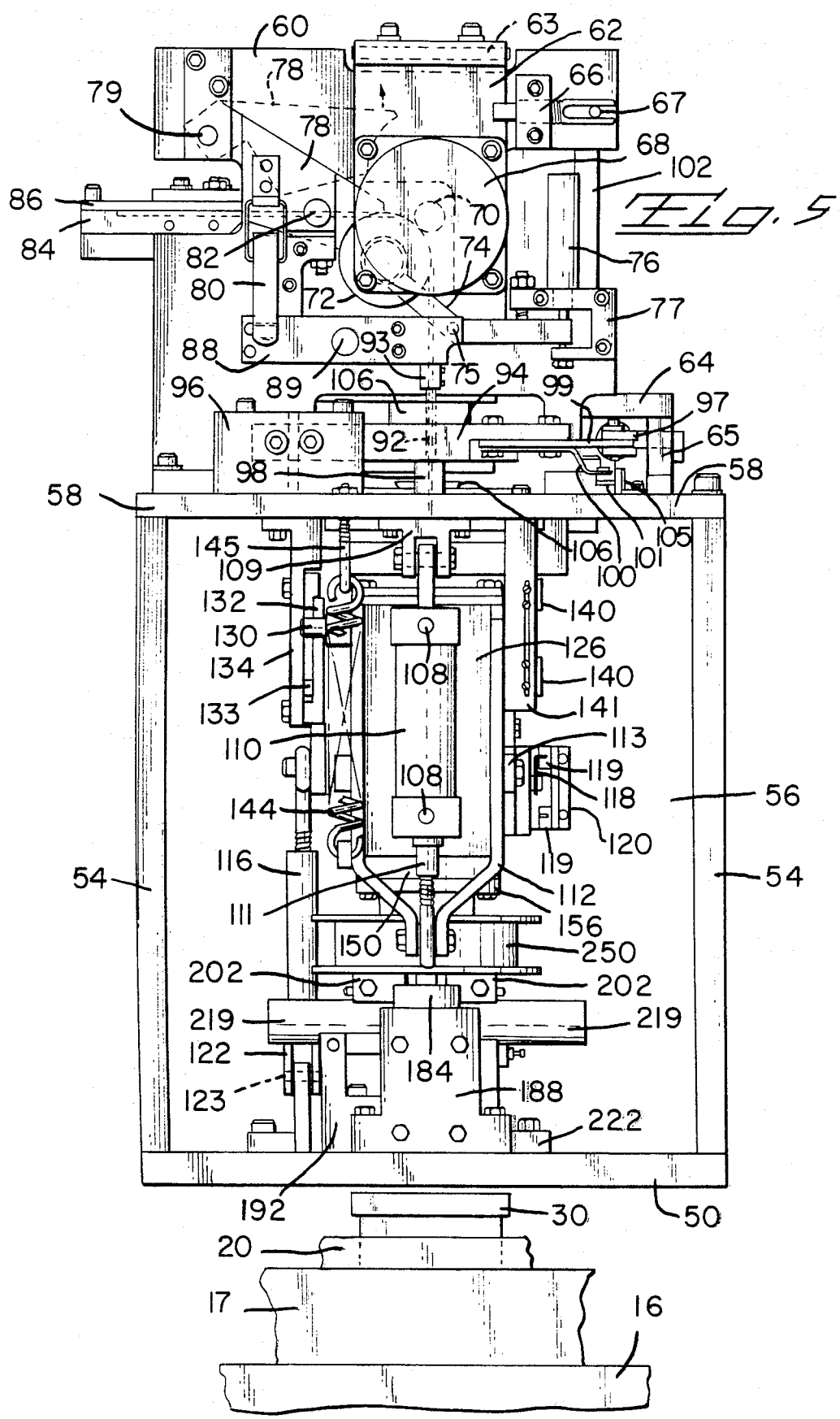

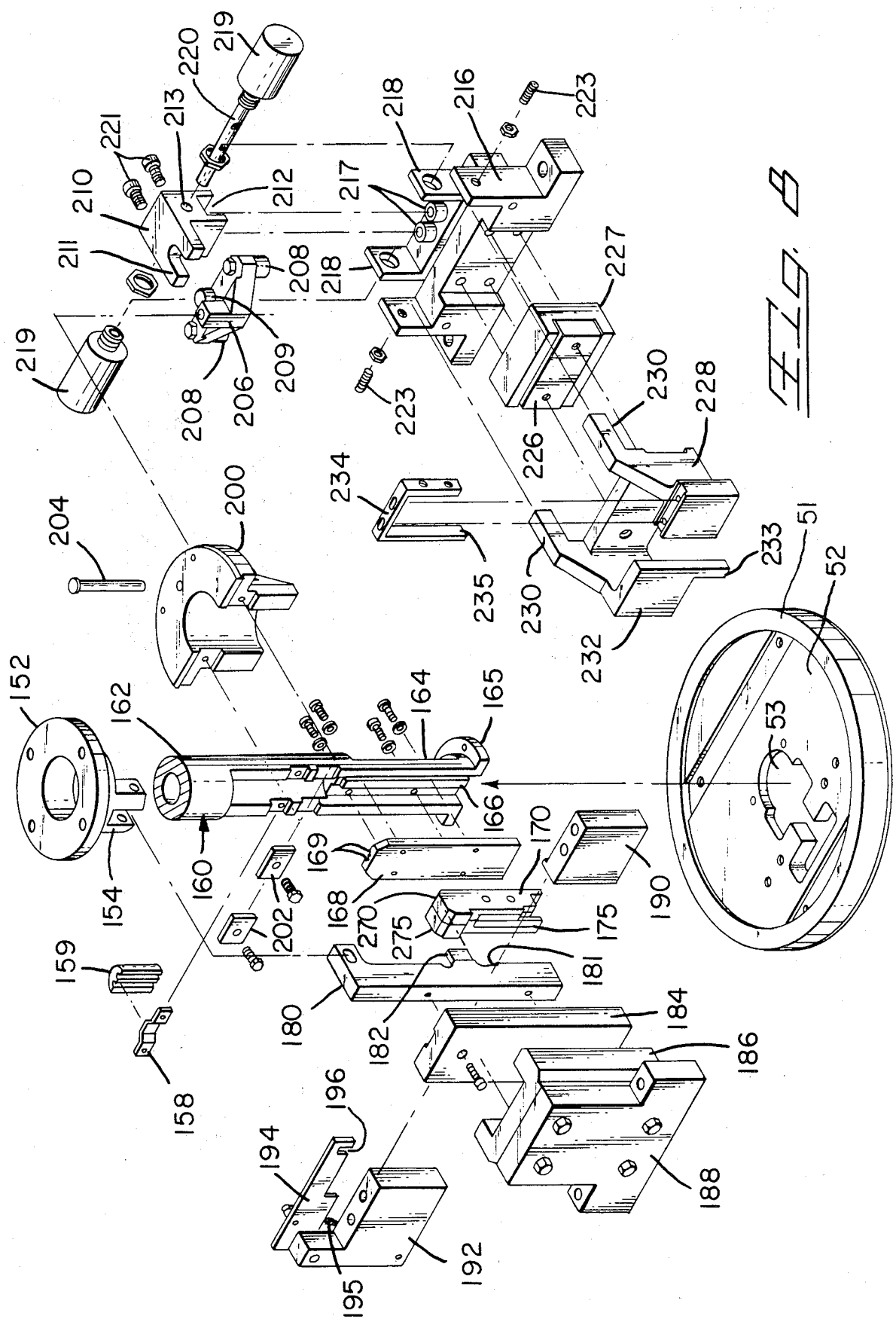

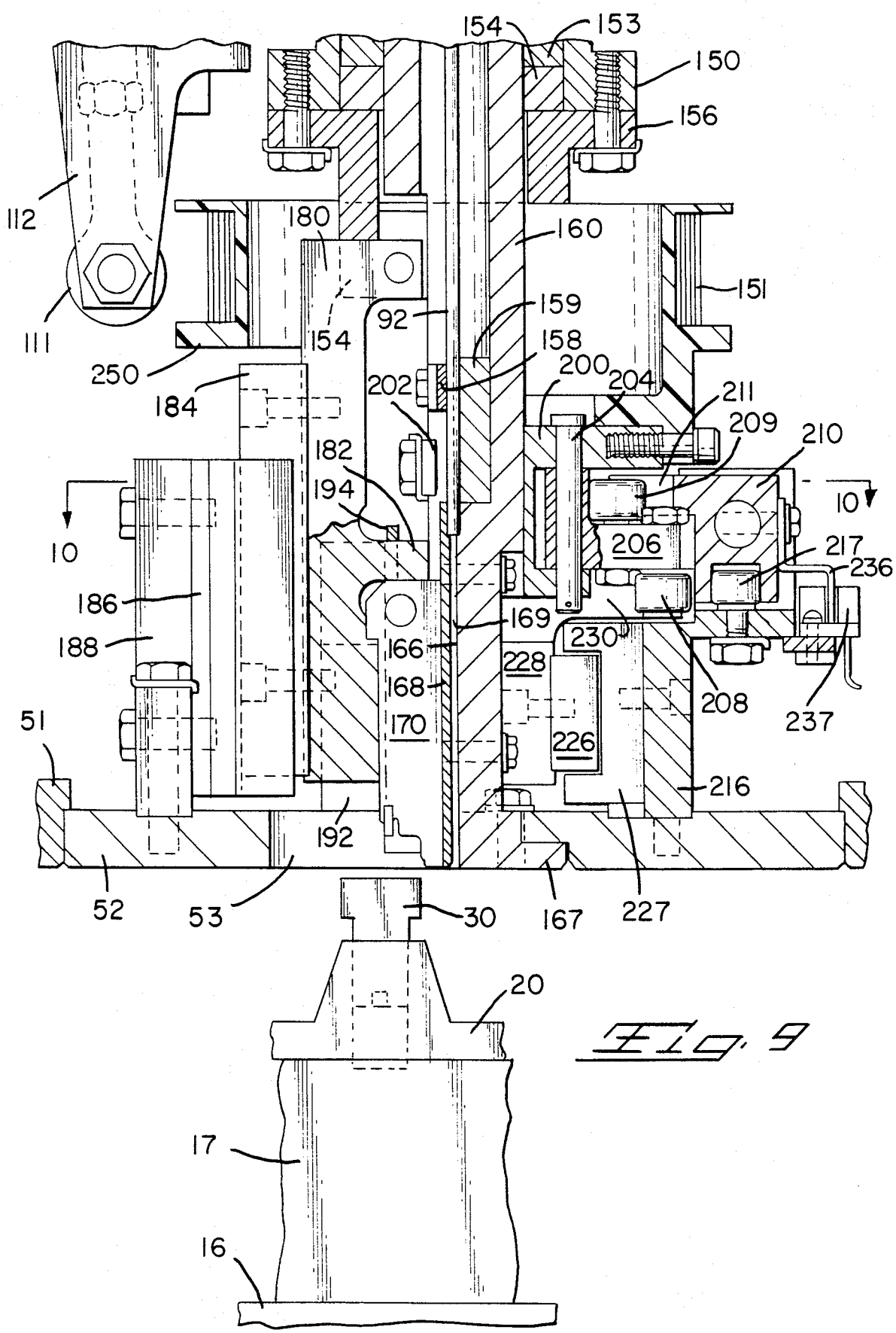

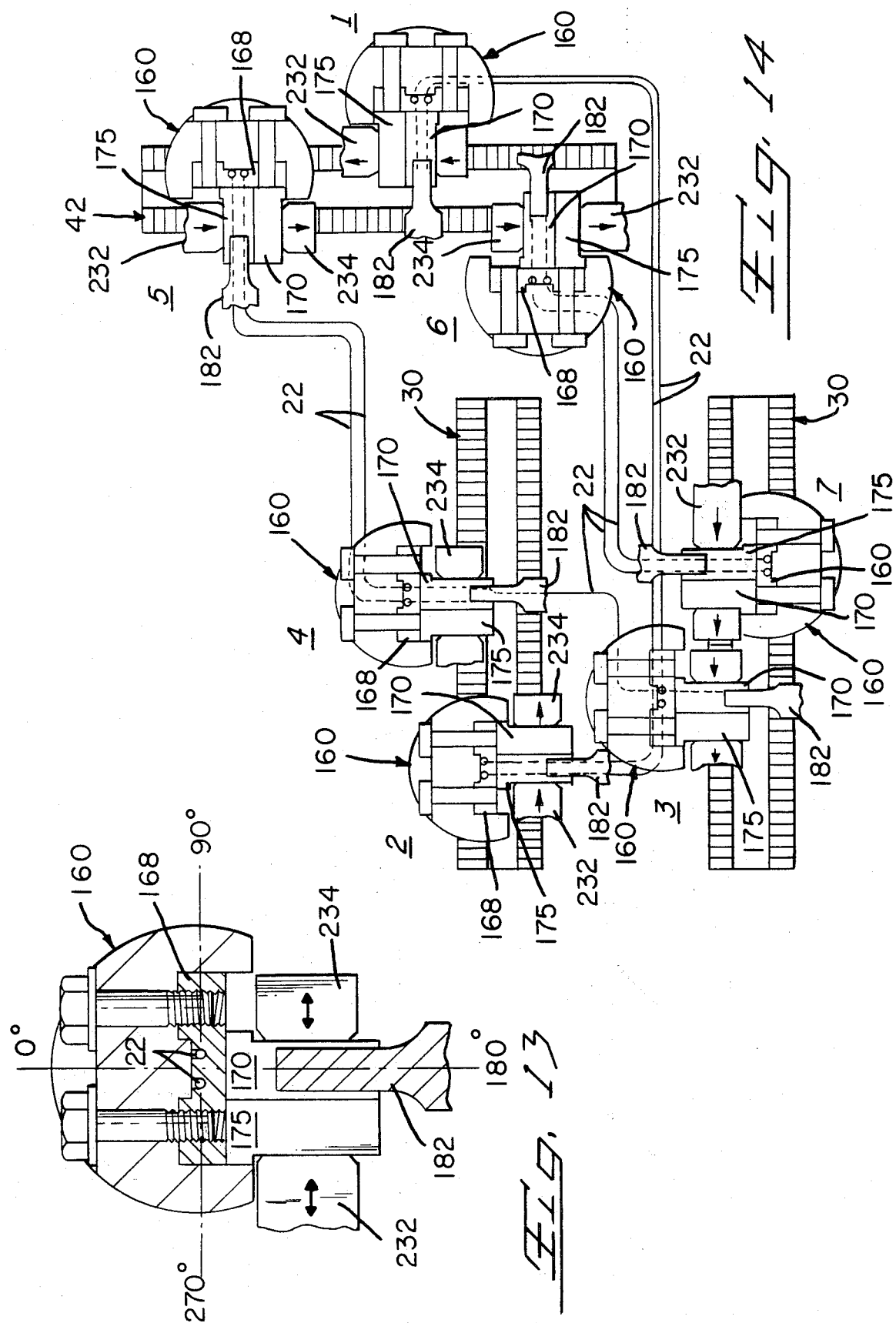

AUTOMATIC WIRING APPARATUS WITH ROTATABLE INSERTION TOOLING

This invention relates to an apparatus for forming electrical connections between terminals having various orientations on a panel board.

Automatic wiring machines which interconnect terminal posts on a panel board are well known. See, e.g., U.S. Pat. Nos. 3,186,077, 3,231,967, and 3,840,962. These machines utilize and X-Y table on which a panel board is mounted for movement in two orthogonal directions. Wire feeding means are provided which synchronize wire feed with table movement so that connections may be made between terminals on paths parallel or diagonal to the orthogonal axes along which the table moves. These prior art machines are adapted to connecting wire to the posts by making wrap-type or clip-type connections, and are limited insofar as they cannot be adapted to terminate wire to terminals which require multiple orientations of the wire insertion tooling. Such terminals are typically slotted-plate type terminals mounted in rows in connector blocks. One such terminal is the AMP ACTION-SLOT terminal described in U.S. Pat. No. 4,220,390. This terminal is typically used in I-O connectors and card edge connectors which are mounted on panel boards. The I-O connectors each have two rows of such terminals and are orthogonally oriented relative to the card edge connectors, which also have two rows of such terminals. Insofar as the terminals have four different orthogonal orientations, each requiring a different orientation of insertion tooling, these panel boards are wired using hand-held insertion tooling.

SUMMARY OF THE INVENTION

The present invention relates to an automatic panel board wiring apparatus having insertion tooling which is rotatable with respect to the X-Y table on which the panel board is mounted, thus enabling wire insertion in terminals having different orientations. The apparatus incorporates a wire feed wheel and a pair of idlers which cooperate therewith to feed a pair of wires downward through a rotation housing along an axis adjacent a pair of inserters located below the housing. The housing and inserters may be rotated to one of four orthogonal orientations to insert two wires into a pair of adjacent terminals in a connector below the inserters. The housing and inserters are driven downward toward the terminals by a yoke having followers which ride in a cam track on the housing between the pivot point of the yoke and an air cylinder which drives the other end of the yoke downward. The inserters are flanked by an additional pair of inserters which may be shifted laterally to the insertion position adjacent the wire feed axis for downward movement with the rotation housing. The different inserters permit either a through-wire type termination, or a termination which shears the wire as it terminates by means of inserters which cooperate with a shear die integral with the connector block. In either case, the wires are positioned over the slots in the terminals by appropriate wire feed and movement of the X-Y table, which are coordinated by a controller. Either one or two wires may be fed depending on whether one or both idlers are pivoted to engage the wires against the feed wheel. As an additional feature, the depth of wire insertion in the terminals may be varied by changing the pivot point of the yoke by rotating the eccentric shaft about which the yoke pivots. This permits two levels of wire to be inserted in a single terminal.

The principal object of the invention is to permit fully automated wiring of a panel board having orthogonally oriented connectors with rows of wire-in-slot type terminals.

Other objects and advantages of the invention will be apparent with reference to the drawings and description which follow.

BRIEF DESCRIPTION OF THE DRAWINGS

FIG. 2 is a schematic perspective of a panel board.

FIG. 3 is a perspective of the connectors with wires inserted therein.

FIG. 4 is a perspective of the wire inserter.

FIG. 5 is a front elevation view of the wire inserter.

FIG. 8 is an exploded perspective of the lower portion of the inserter.

FIG. 9 is a fragmentary side section view showing insertion mechanism.

FIG. 11D is an enlarged fragmentary side section view of the insertion mechanism after wire insertion.

FIG. 13 is a fragmentary section view showing inserter shifter tooling and ram, taken through the center shaft.

FIG. 14 is a diagrammatic plan view of the insertion mechanism in various sequential positions.

DETAILED DESCRIPTION OF THE PREFERRED EMBODIMENT

Figure 1:
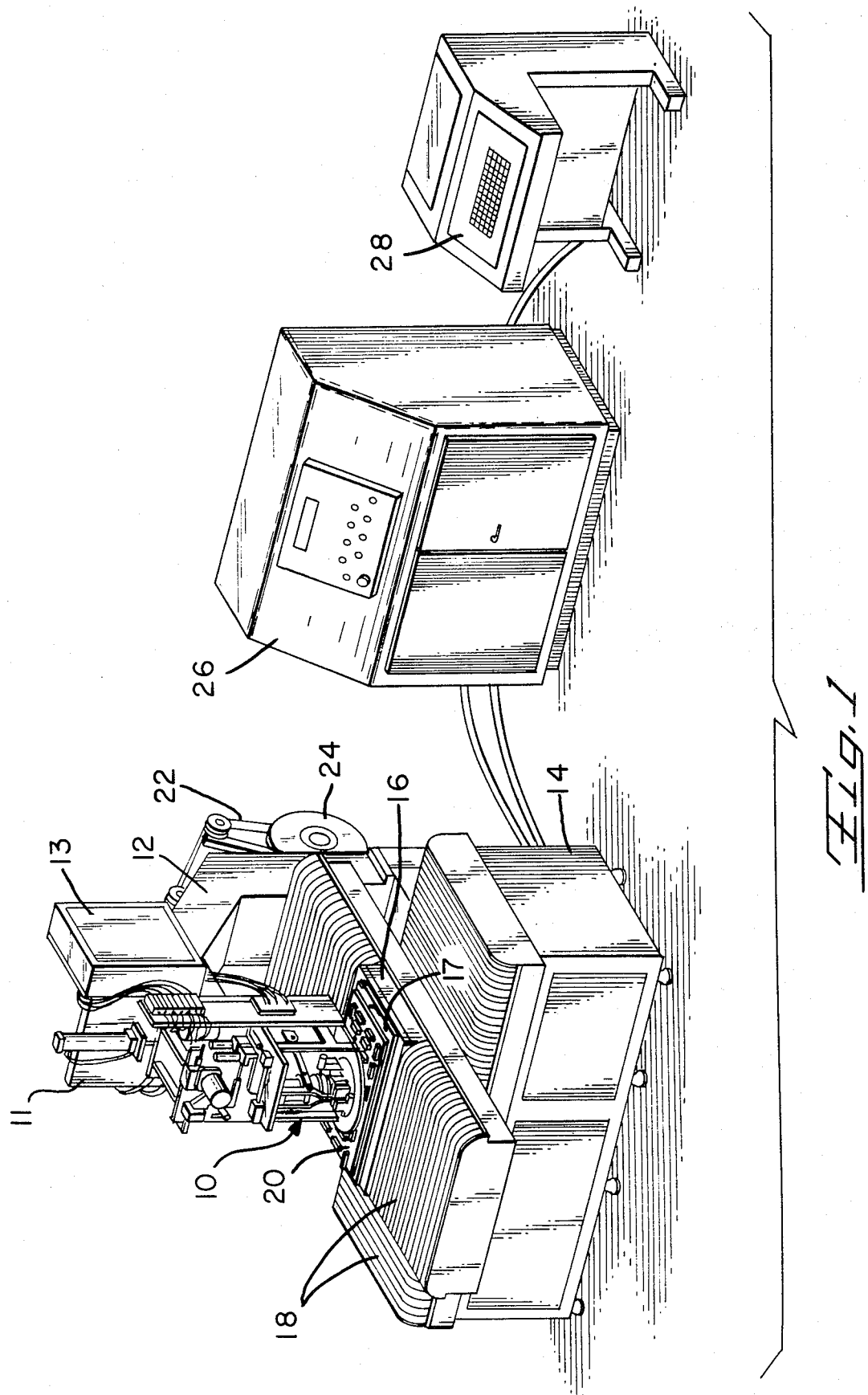
FIG. 1 is a perspective of a program controlled panel wiring apparatus equipped with a rotatable wire insertion mechanism in accordance with the present invention.

FIG. 1 depicts a rotatable wire insertion mechanism 10 in accordance with the present invention as used with an X-Y table 16 for wiring a panel board 20. The mechanism 10 is mounted on a back plate 11 which permits adjusting its position on bracket 12 which is fixed to base 14 housing the controls for the X-Y table. The X-Y table 16 is driven in two orthogonal directions in a horizontal plane by screw drive mechanisms under accordion-like covers 18. The X-Y table 16 carries a fixture 17 which positively positions the connectors on panel board 20 for termination. Bracket 12 carries reels 24 for supplying wire 22 to the insertion mechanism 10 as well as a junction box 13 for wire distribution to the controls for the pneumatics and electrical motors which effect movement of the mechanism 10. A control cabinet 26 and auxiliary programmer 28 provide inputs to the mechanism 10 and X-Y table 16 to coordinate desired wiring of a given panel board.

FIG. 2 is a schematic of a panel board 20 showing the general layout of I-O connectors 42 and card edge connectors 30 mounted thereon. FIG. 3 depicts the I-O connectors 42 and card edge connectors 30, as interconnected by wires 22, in greater detail. As the wire receiving ends of the terminals 32 are identical in either connector, the same numerals are used. Each terminal 32 is formed with a bight 34 adjacent its free end 35, and parallel slots 36 in the bight 34 and the free end 35 are deep enough to receive wires 22 at two levels, so that two wires may be terminated in a single terminal 32. Card edge connectors 30 have slot lead-ins 38 which align wires 22 with slots 36, and by-pass lead-ins 39 which align the wires 22 past terminals 32. The I-O connectors have only slot lead-ins 43. An integral shear die 45 runs the length of connector 42 and serves to sever wires in cooperation with the insertion mechanism as will be described. A similar die 40 (visible in FIG. 11) is formed in the card edge connector 32.

FIG. 4 shows the rotatable wire insertion mechanism 10 of the present invention. Frame members include the back mounting plate 56, lower plate 50, upper plate 58, and side support pieces 54 which are connected to back plate 56 by lateral struts 55. The upper plate 58 supports top vertical plate 60 which is braced thereto by braces 61. The wire feed motor 68 is mounted to plate 62 which is hinged to pivot block 63 on the top of plate 60. A spring loaded plunger 67 through block 66 mounted on plate 60 locks the motor 68 in the position shown. Air cylinders 76 on mounting blocks 77 pivot levers 74 about pivot points 75 to move idler wheels 72 which hold wires being fed against a feed wheel 70 (FIG. 5). The wires are trapped in channels in plate 60 by channel covers 78 on opposite sides thereof, the covers 78 being pivotably carried in pivot blocks 79 mounted on the plate 60. The wires are carried to the plate 60 in grooves on guide plate 84, retained therein by retainer plate 86. Air cylinders 82 carried on the covers 78 actuate wire stops which prevent overrunning the wire. Head rotation motor 102 is mounted on plate 64 which is spaced from plate 58 by support 65. The motor 102 drives a center shaft gear 104 to effect rotation of the mechanism below plate 58. Rotation locking rack 94 rests slidably on plastic support block 98 and is pivoted in bracket 96. The rack 94 is actuated by air cylinder 95 mounted to plate 65 and locks the gear 104 in position after rotation. A switch lever 100 carried on the rack extension 99 moves between switches 101 to provide feedback to the controller as to the position of rack 94. Several switches on the apparatus 10, as will be described, provide similar feedback to insure proper sequential operation of various components.

Referring still to FIG. 4, rotary plate 52 is mounted in bearing 51 which is mounted in bottom plate 50 to permit rotation of components mounted on plate 52. Rotation is effected by motor 102 driving gear 104 fixed to the top of a center shaft 160 (FIGS. 8 and 9) by nut 106. Rotation housing 150 is cicumscribed by a cam track 151 which a follower 117 journaled to yoke 113 rides in. The yoke 113 is pivoted on eccentric shaft 114 at one end and driven up and down at the other end by air cylinder 110 which acts on bracket 112 to which the yoke 113 is pivotably mounted. Thus the rotation housing 150 is free to rotate while being movable vertically.

The angular orientation of eccentric shaft 114 is determined by air cylinder 116 acting on a lever at the opposite end of shaft 114 from shaft support 115, which also serves for mounting switch bracket 120. See also FIG. 6. Switches 119 on switch bracket 120 are actuated by switch vane 118 to provide feedback as to position of shaft 114, which determines the limits of travel of the rotation housing 150. The housing 150 acts on ram 180 which drives wire inserters to insert wires into terminals, the angular position of eccentric shaft 114 thus determining insertion depth. The bracket 112 also has a follower 130 journaled thereto which acts on stops 132 and 133 to dampen movement of the yokes 113, as will be shown in greater detail in FIGS. 6 and 6A. Spring 144 serves to prevent downward motion when air pressure is shut off. Bracket 141 on the underside of plate 58 carries switches 140 which provide feedback to the controller as to the position of bracket 112.

Other salient features apparent in FIG. 4 are the ram mounting block 184 and insertion slide 186, which together form a ball slide assembly which is fixed to insertion slide mounting block 188. Inserters 170 are acted upon by ram 180 as the rotation housing 150 moves downward. The inserters 170 may be shifted laterally so that inserters 175 (FIGS. 8 and 13) are acted upon by the ram 180. Inserter shifting is accomplished via opposed solenoids 219 fixed to solenoid bracket 216; the solenoids move forked shifter 210 which acts on toggle arm 206 to move the shifter bracket 228 which shifts the inserters laterally.

FIG. 5 shows the wire feeding mechanisms mounted atop plate 58 to best advantage. Two wires received from reels on the rear of the apparatus (FIG. 1) are captured in grooves 85 in guide plate 84 by retainer plate 86. From there the wires are captured in channels on opposite sides of top vertical plate 60 by wire channel covers 78, held in place by clip 80. Releasing clip 80 permits counterclockwise pivoting of the cover 78 about pin 79 to expose the wires. Feed motor 68 drives a feed roller 70 which traps the wire against idler wheel 72. When pressure in air cylinder 76 is released, the idler 72 pivots counterclockwise about pin 75 in plate 60 so that wire feed ceases; pivoting force is provided by a spring in bottom of mounting block 77. Air cylinder 82 is pressurized simultaneously to actuate a wire stop mounted in cover 78. Sliding retainer block 88 may be moved leftward by releasing detent pin 89 so that lever 74 carrying idler 72 may be removed if necessary. The block 88 also holds guide tube clamp 93 in place in top vertical plate 60; the clamp 93 is clamped on the entry end of two wire guide tubes 92 which pass through nut 106 into the middle of center shaft 160 (FIG. 9). Each guide tube 92 is formed of a wire helix to permit overall flexibility without locally impeding the feeding of wire therein. Rack 94 is pivoted in block 96 as it engages and disengages gear 104 under the action of air cylinder 95. Switch vane 100 mounted under rack extension 99 actuates switches 101 to indicate rack position.

Referring still to FIG. 5, it will be evident that upper and lower stops 132, 133 are carried by stop bracket 134 under top plate 58. Ports 108 at opposite ends of cylinder 110 provide inlets for pneumatic tubing, which has been eliminated from the various drawings for clarity. Bracket 112 incorporates a back plate for stability, hiding much of the rotation housing 150 from view. Lower bushing retainer 156 is fixed to the bottom end of housing 150. Center shaft 160 passes through housing 150 and wire spool 250, which receives control wires loosely therearound and permits rotation of the housing without tangling control wires. Ram 180, fixed to ram mounting block 184, is arranged for vertical sliding movement relative to insertion slide mounting block 188. Opposed solenoids 219 effect lateral movement of inserters 170, 175 (FIG. 8). A connector 30 on panel board 20 mounted on fixture 17 for movement with X-Y table 16 is shown as positioned beneath bottom plate 50.

Figure 6:
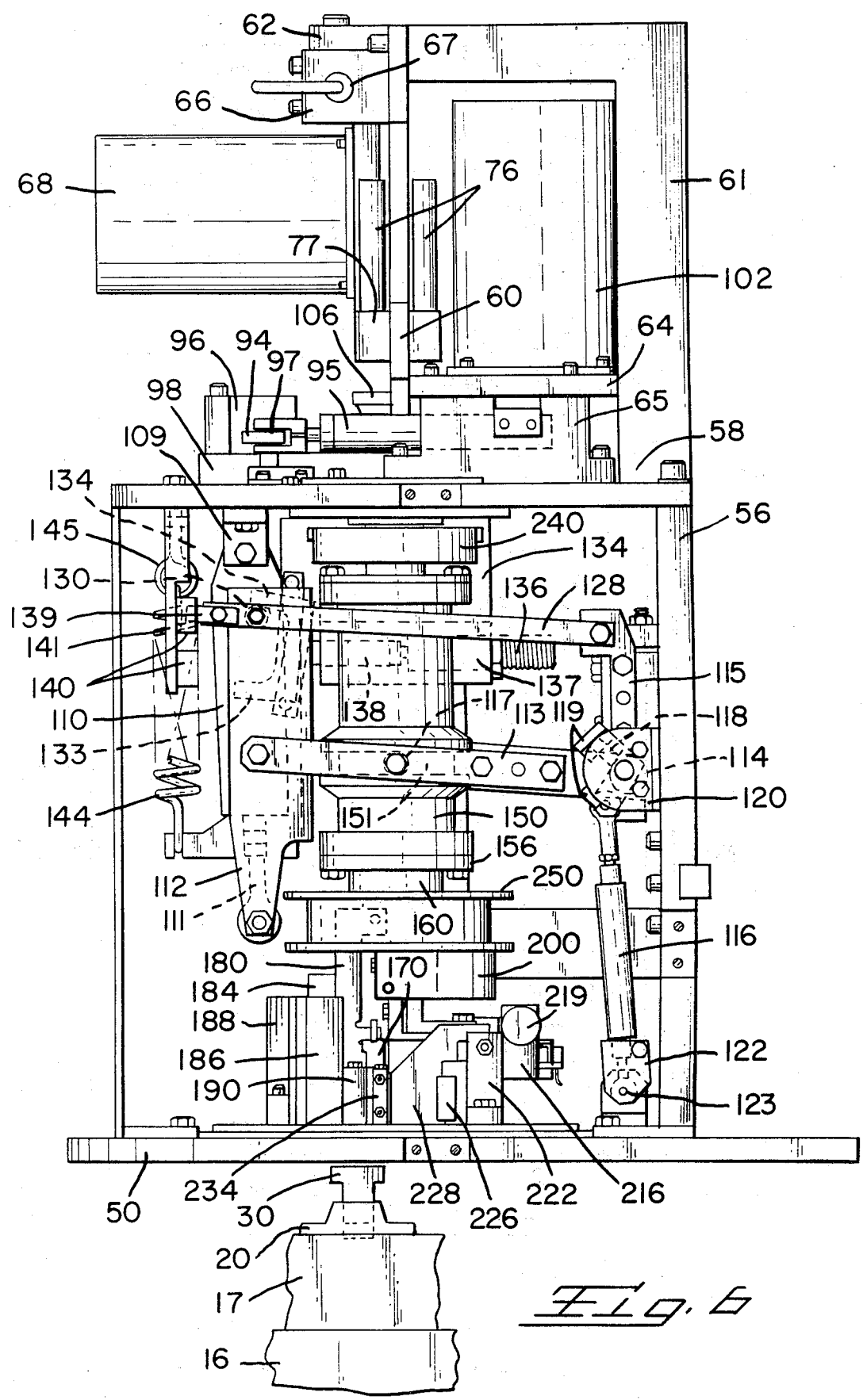
FIG. 6 is a side elevation view of the wire inserter.
Figure 6A:
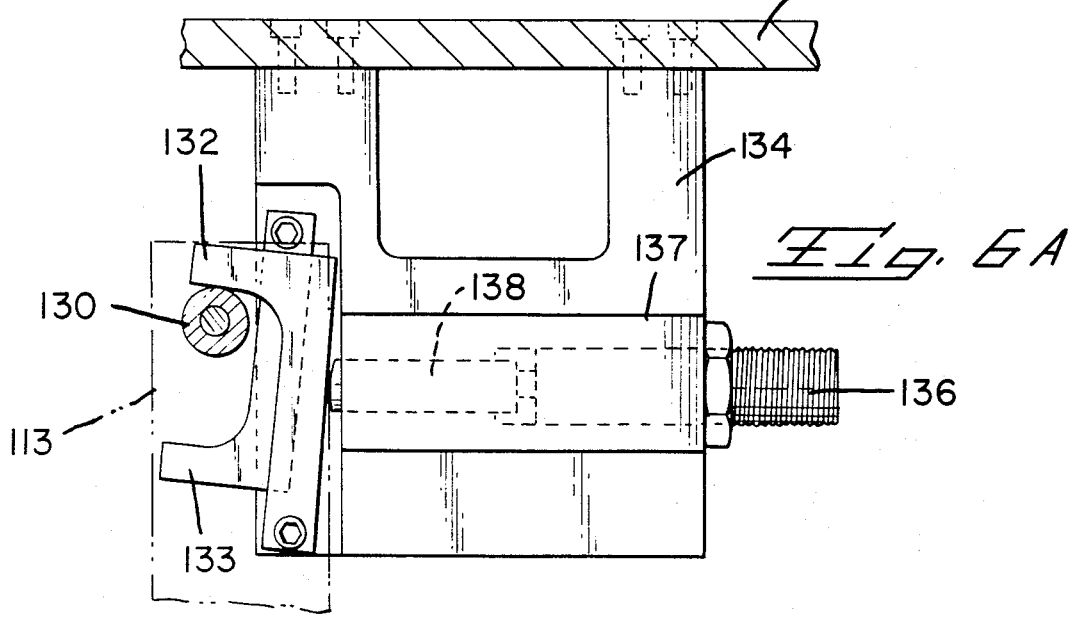
FIG. 6A is a side elevation view of the damping mechanism for the insertion tooling.

The linkage effecting vertical movement of the rotation housing 150 and associated insertion mechanism may be best understood with reference to FIG. 6. Insertion yoke 113 is pivoted on eccentric shaft 114 carried by eccentric shaft support 115 adjacent back mounting plate 56. Air cylinder 116 pivoted at clevis 122 adjacent bottom plate 50 effects rotation of eccentric shaft 114 which varies the height of yoke 113 and thus via follower 117 in cam track 151, the height of the rotation housing 150. Since the rotation housing is fixed relative to ram 180, the cylinder 116 thus affects insertion depth. Stabilizer lever 128 also pivots proximate to wall 56 and is pivotably fixed to bracket 112 at its opposite end, which also carries a switch vane 139 to indicate the vertical position of the rotation housing 150. The upper and lower stops 132, 133 shown in phantom here appear in greater detail in FIG. 6A; note there that the follower 130 carried by bracket 112 alternately hits stops 132, 133 as the bracket 112 moves up and down. Both stops 132, 133 move against shock absorber 138 which is carried in shock mounting block 137 which is fixed to the stop bracket 134. Note in the reference to FIG. 6 that, while there are yokes 113 with followers on both sides of housing 150, there is only one stabilizer lever 128.

Figure 7:
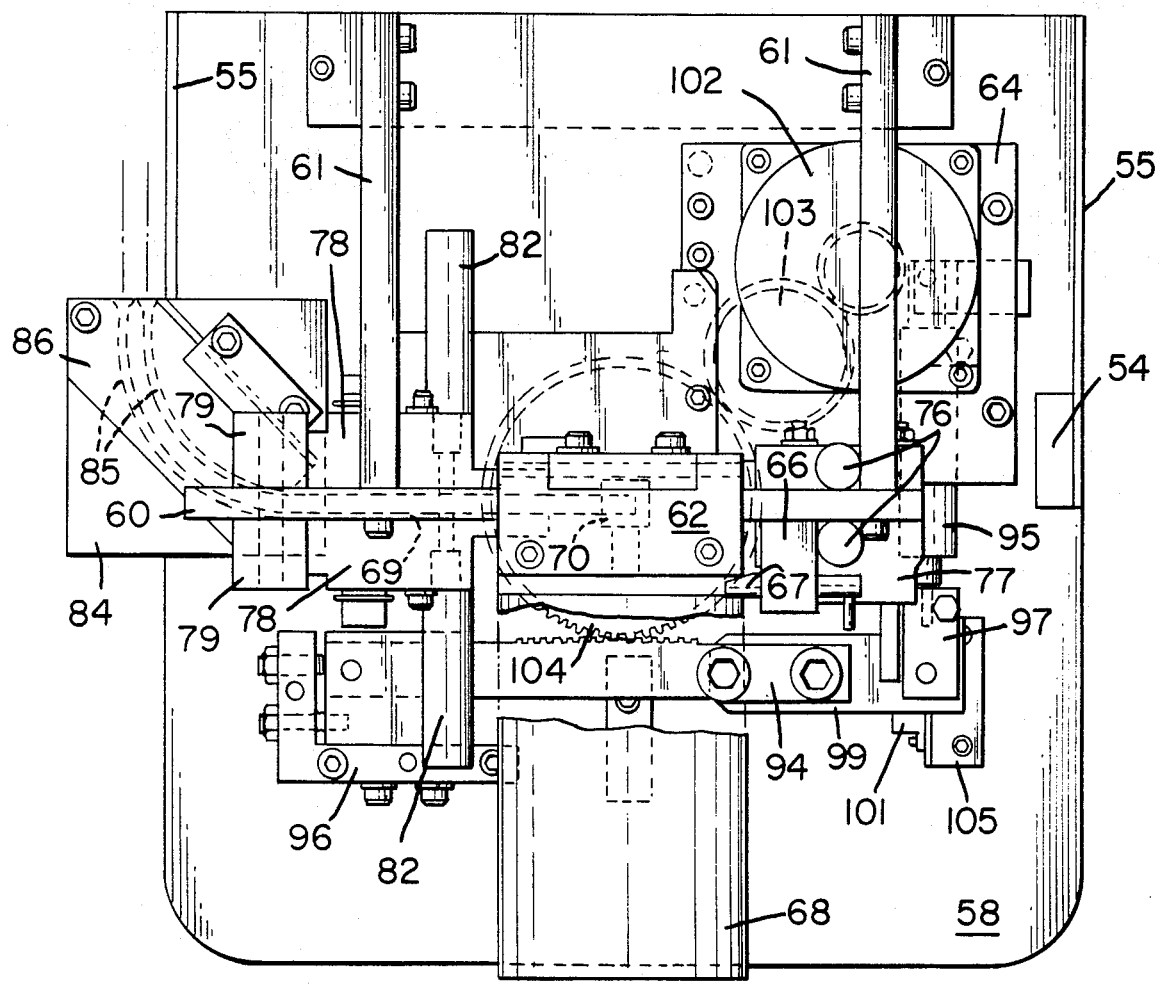
FIG. 7 is a plan view of the wire inserter.

FIG. 7 offers good vantage of the wire feed arrangement described in conjunction with FIG. 5. Retainer plate 86 captures wires in grooves 85 in wire guide plate 84, which directs wires to channels 69 in top plate 60, where they are captured by opposed channel covers 78. Channels 69 direct the wires to feed wheel 70 which is driven by motor 68 (idler wheel below not shown). The head rotation motor 102 mounted on plate 64 drives intermediate gear 103 which in turn drives the main gear 104. Rack 94 is shown engaging gear 104 to insure that the rotation housing 150 below (FIG. 6) will not undergo angular movement during wire insertion.

FIG. 8 is an exploded perspective of the insertion tooling which mounts on rotary plate 52. Center shaft 160 is mounted through profiled aperture 53 and bottom flange 165 is bolted to the underside of plate 52; bottom seal 152 is carried slidably on tubular section 162 of shaft 160. The bottom seal 152 has an integral clevis 154 which is pinned to insertion ram 180, which is fixed to ram mounting block 184. Block 184 is slidably carried by insertion slide 186 which is fixed to insertion slide mounting block 188, which is bolted to rotary plate 52. The block 184 and slide 186 form a ball slide assembly which is available as a unit. Ram 180 is flanked by right and left inserter support blocks 190, 192 respectively which are bolted to rotary plate 52. Inserters 170, 175 have respective anvil portions 270, 275 which fit into recess 181 in the ram 180. Ram 180 has a ram arm 182 which acts on either anvil 270 as anvil 275 overhangs block 192, or anvil 275 as anvil 270 overhangs block 190. Lateral shifting of inserters 170, 175 by shifter bracket 228 will now be described.

Referring still to FIG. 8, pivot bracket 200 is fixed to center shaft 160 by retainer plates 202, which are bolted to bracket 200 and fit in notches in the bottom portion 164 of shaft 160. A toggle arm 206 pivots about pin 204 fixed in bracket 200 and causes outboard followers 208 to act on arms 230 of pivot bracket 228, which in turn causes left and right inserter pushers 232, 234 to act on inserters 175, 170 respectively. Pusher 232 is integral with bracket 229, while inserter 234 is bolted thereto so its position may be adjusted. Legs 233, 235 fit into aperture 53 in bottom plate 52 and serve to guide the movement of inserters 170, 175. The bracket 228 is mounted to ball slide 226 which is slidably carried in slide mount 227 which is fixed to solenoid bracket 216. Bracket 216 is bolted to rotary plate 52 and carries solenoids 219 in uprights 218; the solenoids have a common plunger 220 which fits into hole 213 in shifter 210 to effect lateral movement of the shifter 210, which has a channel 212 which fits on rollers 217 on bracket 216. The plunger 220 is positioned in hole 213 by set screws 221. Shifter 210 has an integral fork 211 which acts on inner follower 209 on the toggle 206 to translate side-to-side movement of the shifter 210 to pivotal movement of the toggle 206, which in turn is translated into side-to-side movement of shifter bracket 228 via followers 208 and arms 230. Studs 223 screw into solenoid bracket 216 and provide a fine adjust for limiting movement of bracket 228 and inserters 170, 175.

FIG. 8 also depicts the wire guide means in the vicinity of the insertion tooling. The flexible guide tubes 92 (FIG. 9) are clamped in inset 159 by clamp 158 which bolts to center shaft 160. Wires 22 (FIGS. 11) exit the guide tubes below the clamp 158 and are trapped in grooves 169 in plate 168, which holds the wires against guide surface 66. Plate 168 also serves as a guide surface for inserters 170, 175.

FIG. 9 is a cross-sectional view of the components described in conjunction with FIG. 8, as assembled. Ball bushing 153 is contained concentrically between rotation housing 150 and center shaft 160 permitting relative vertical movement therebetween. Lower bushing retainer 156 is bolted to housing 150 and effects vertical movement of ram 180 as the housing 150 moves vertically in response to pivotal movement of yoke 113 (FIGS. 4 and 6). Spool 250 is bolted to pivot bracket 200, which serves as a pivotal mount for toggle 206 as previously described. The spool 250 carries flat flexible cable 251 which provides power for solenoids and feedback from switches mounted on the rotating components. Bracket 216, in addition to carrying ball slide assembly 226, 227 for shifter bracket 228 and followers 217 for slidable movement of shifter 210, provides mounting for switches 237. A switch vane 236 bolted to shifter 210 moves between switches 237 to provide feedback to the controller which verifies which of inserters 170, 175 are in position for inserting wires into connector 30 on panel board 20 below. The panel board 20 is mounted on fixture 17 which is carried by X-Y table 16 below rotary plate 52 as shown. The plate 52 is journaled in bearing 51 for rotation about an axis through the center of center shaft 160 where wire guides 92 pass therethrough, so that the wires (not shown) passing through grooves 169 between plate 168 and guide surface 166 will merely change positions as the insertion tooling rotates through 180°.

Figure 10:
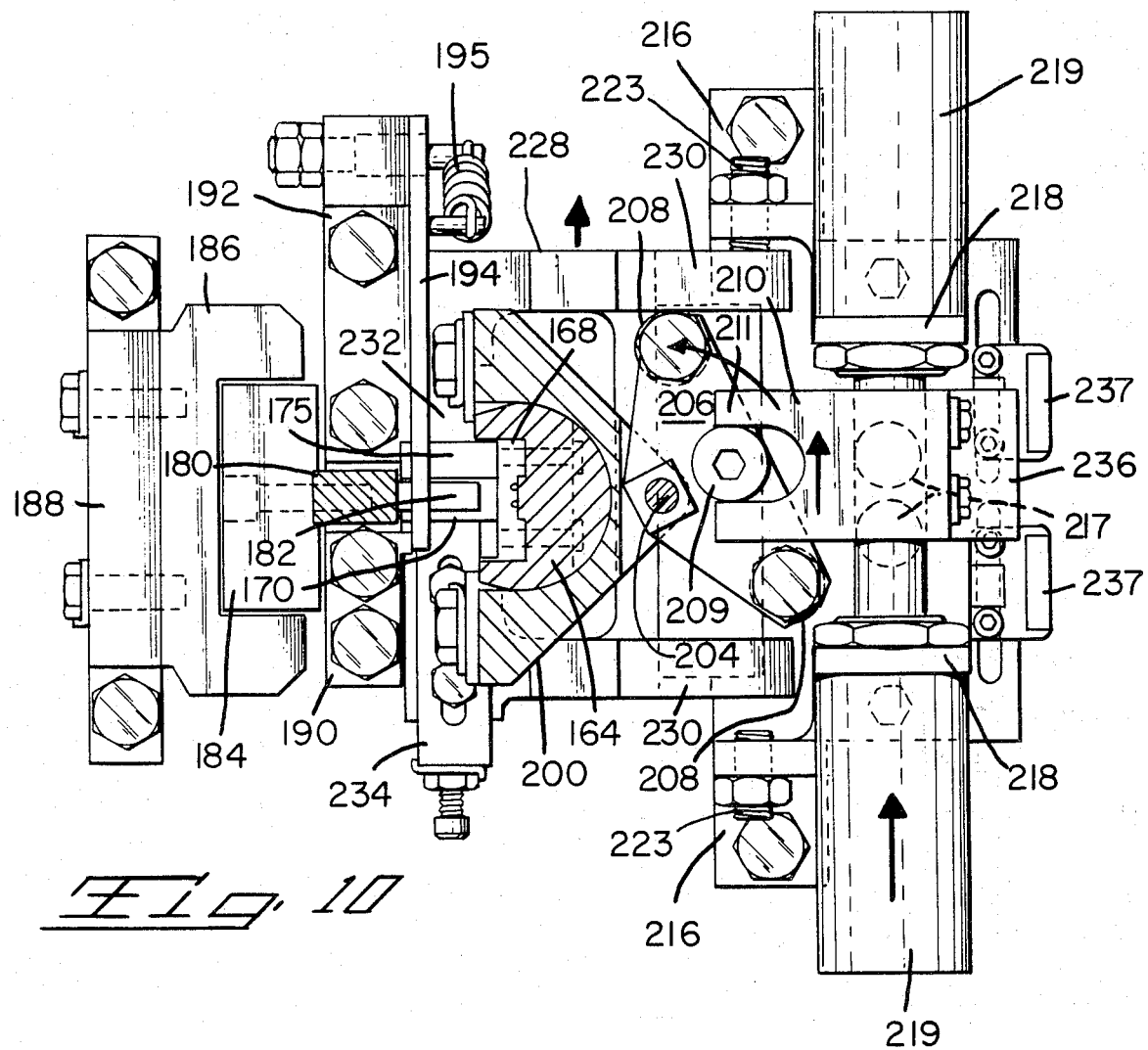
FIG. 10 is a top section view of the insertion mechanism taken along line 10—10 of FIG. 9.

FIG. 10 is a section view of the inserter shifting apparatus described in conjunction with FIG. 8, as assembled. Solenoids 219 mounted in uprights 218 of bracket 216 act on shifter 210 which pivots toggle 206 about pin 204 in bracket 200. This causes one of outboard followers 208 to bear against one of arms 230, so that pusher 234 bears against inserter 170 as shown, or pusher 232 bears against inserter 175. This causes the inserter being pushed to be vertically aligned with ram arm 182, so that downward movement of ram 180 effects wire termination as will be discussed in conjunction with FIG. 11. The idle inserter, 175 as shown in FIG. 10, is barred from downward movement by one of inserters 190 or 192, 192 as shown in FIG. 10. Upward movement is prevented by inserter hold down bar 194, which is pivotably carried by pusher 192 and held down by spring 195. The hold down bar 194 has a channel 196 (FIG. 8) which fits on ram arm 182.

Figure 11C:
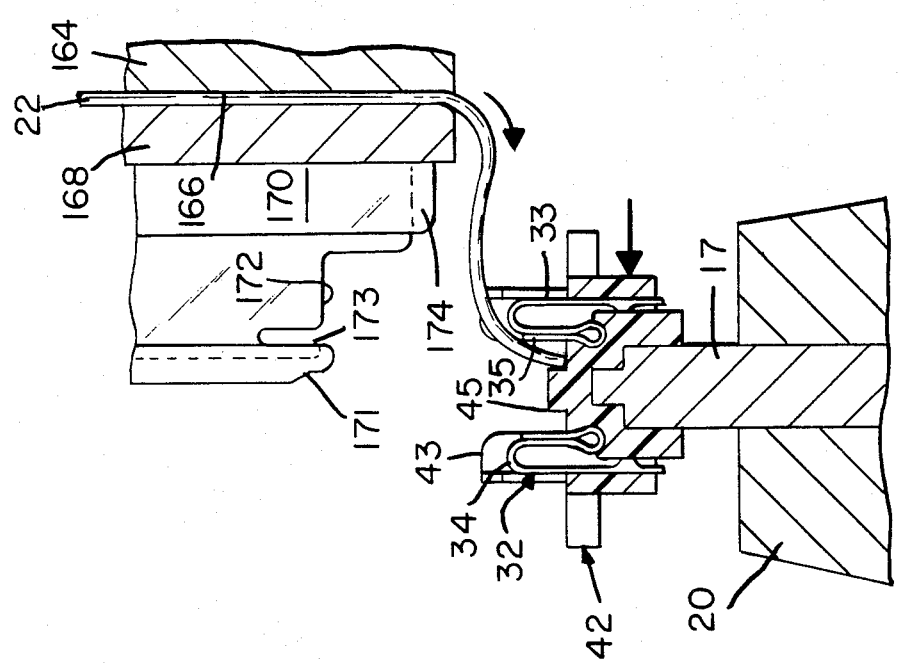
FIG. 11C is an enlarged fragmentary side section view of the insertion mechanism after movement of X-Y table.
Figure 11B:
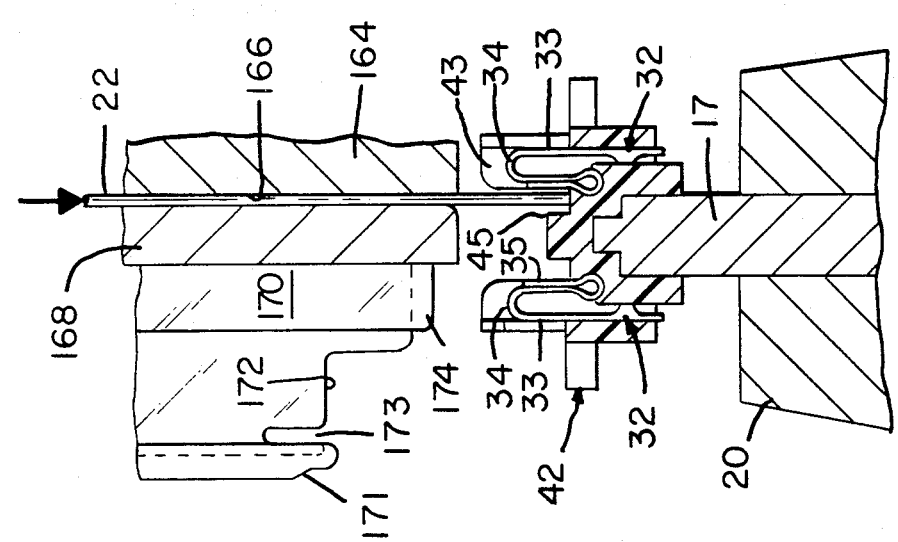
FIG. 11B is an enlarged fragmentary side section view of the insertion mechanism after wire feed into the connector.
Figure 11A:
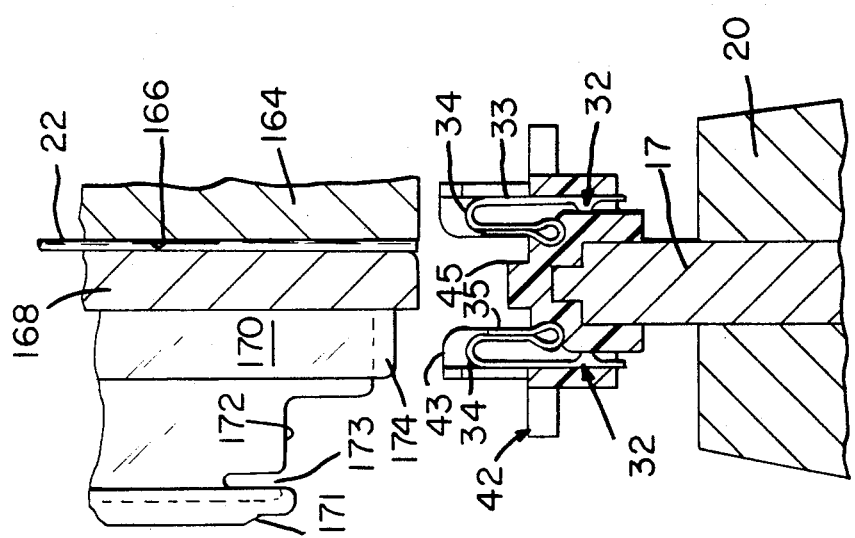
FIG. 11A is an enlarged fragmentary side section view of the insertion mechanism prior to wire feed.
Figure 110:
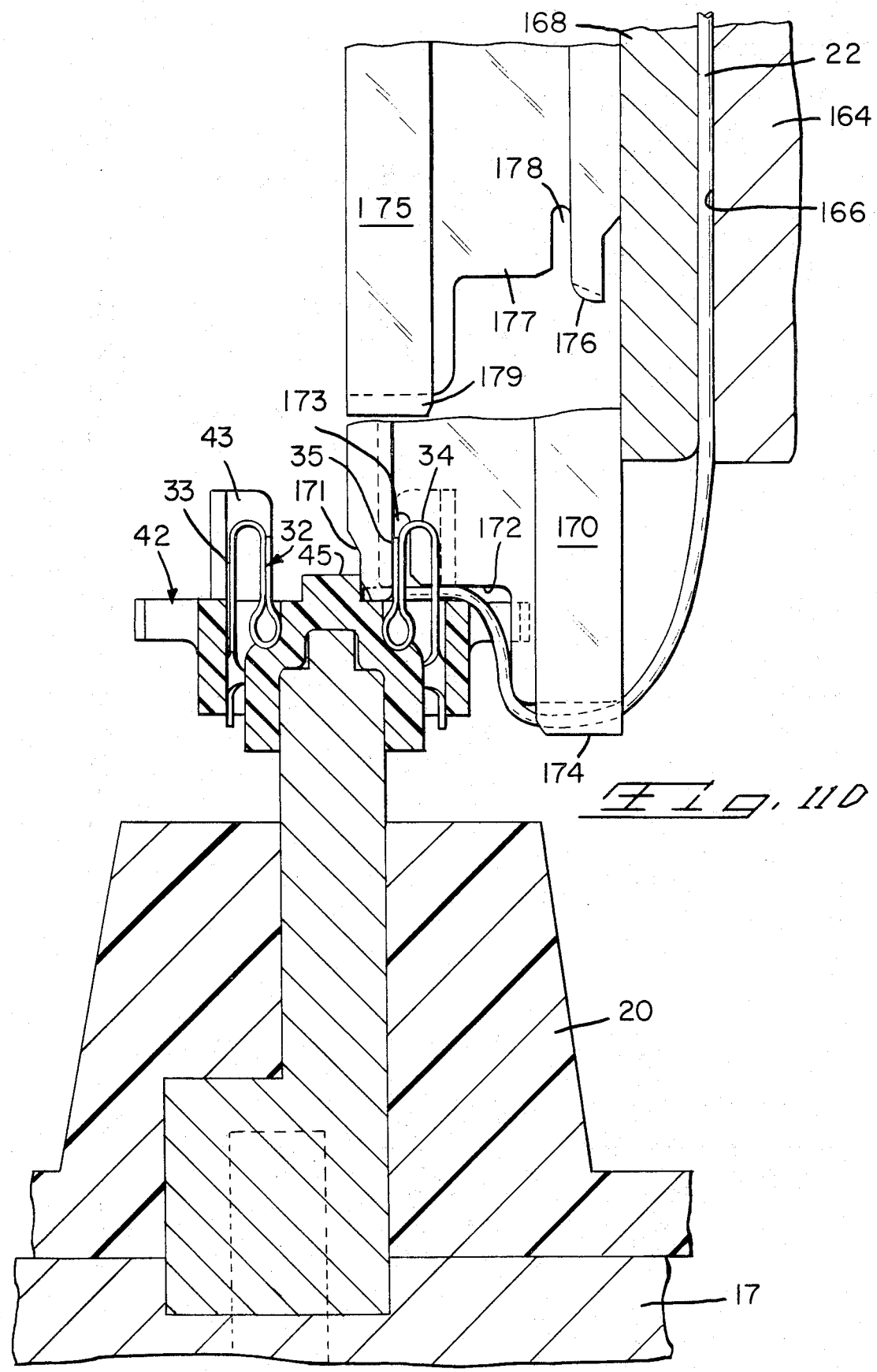

FIG. 11A depicts the first step in terminating the end of wire 22 to a terminal 32; here the X-Y table 16 (FIG. 1) is moved so that the panel board is positioned with wire 22 aligned directly above a point on the connector 42 adjacent terminal 32. The wire is then fed downward as shown in FIG. 11B until it abuts the connector 42 between shear block 45 and terminal 32. The X-Y table is then moved as shown in FIG. 11C while wire 22 is simultaneously being fed, so that the end of wire 22 is not displaced while an adjacent portion lies in slot lead 43 in the connector against the bight 34 of terminal 32. Inserter 170 is thus aligned over an I-O connector 42 so that the insertion section 172 overlies the terminal. FIG. 11D shows actual wire insertion; forward wire guide 171 comes down between shear block 45 and free end 35, which is received in slot 36 in the terminal. Insertion section 172 is narrow enough to push wire 22 into slot 36 (FIG. 3) in terminal 32, and is arcuately profiled to keep the wire centered therein. Rear wire guide 174 is profiled with a trough which captures the wire 22 as additional wire is fed to compensate for downward movement of the inserter 170. Note that while FIGS. 11A through 11D show the termination of the end of a wire, termination of a mid portion is possible since the forward wire guide 171 is profiled with a trough on the vertical edge which faces shear block 45, which would permit the wire to pass therethrough so that a continuous length of wire could be terminated to terminals in several connectors. Note also that an additional through-wire type inserter 170 is located adjacent to and behind that shown here, thus permitting simultaneous termination of two wires, which the apparatus is arranged to feed in parallel relationship. The upper portion of inserters 170 is shown cut away so that inserters 175 are visible.

Figure 12:
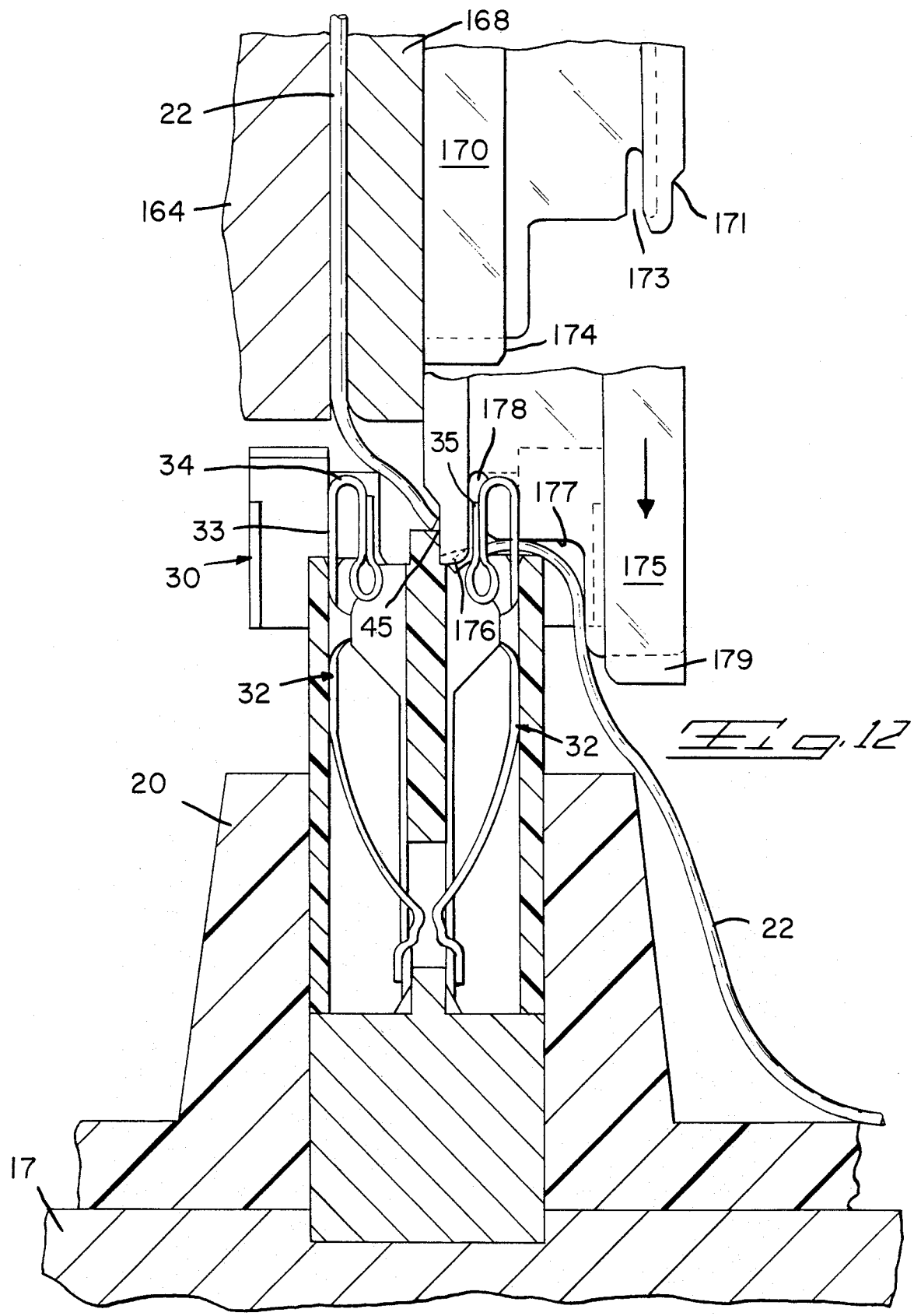
FIG. 12 is an enlarged fragmentary side section view of the insertion mechanism after cut-off inserter terminates a wire.

FIG. 12 shows the insertion of a wire 22 by an inserter 175 into a terminal 32 in a card edge connector 30. Inserter 175 is equipped with a shear blade 176 which does not permit the wire 22 to pass through but shears it against shear block 45 as shown. Inserter 175 has a slot 177 which receives the free end 35 of the terminal 32 and an inserter 177 which forces the wire into the terminal. Wire guide 179 may capture the wire where the programmer allows less slack than here shown. The unterminated wire may be drawn back into section 164 of the center shaft prior to moving the X-Y table to the next terminating position.

FIG. 13 is a cross section taken through bottom section 164 of center shaft 160, guide plate 168, and ram arm 182. Inserter pushers 232, 234 are shifted so that through wire inserter 170 is in position for wire insertion. The insertion tooling is in one of four possible orthogonally opposed positions, so labeled here in 90° increments.

FIG. 14 is a schematic showing seven consecutive positions of the tooling relative to the panel board as the tooling rotates and the X-Y table moves in two directions. POSITION 1 shows the tooling in the 90° position with inserter 170 in position for termination. After termination, the tooling is rotated counterclockwise to the 0° position and additional wire is fed as the X-Y table moves to POSITION 2, where inserter 175 is in position to insert wires 22 into side-by-side terminals in connector 30, shearing the wires at the same time. At POSITION 3, the tooling is still in the 0° position, the X-Y table having moved and the inserters having shifted so that inserter 170 is positioned to insert a single wire into the adjacent card edge connector 30. This is possible by engaging only one of idler wheels 72 (FIG. 5), so that only a single wire is fed when the feed motor is energized.

Subsequent to insertion, the wires are fed and the X-Y table moves so that the wire passes through a by-pass lead-in 39 (FIG. 3) between terminals in the adjacent card edge connector 30. Immediately after passing through this lead-in, the X-Y table jogs a distance equal to one half the spacing between terminals so that the wire will be aligned with a slot 36 in a terminal in the adjacent row. At this point the other idler wheel 72 is engaged and the second wire is again fed so that both wires are terminated by inserter 170, as shown at POSITION 4. From POSITION 4, the insertion tooling is rotated to the 90° position and the wire is fed while the X-Y table moves to POSITION 5, where inserter 175 terminates and simultaneously shears the wires. Note that since inserter 170 is not effective to shear the wire, a single length is continuous from POSITION 4. This would be possible through any number of card edge connectors 30, and would of course be possible feeding two wires for insertion in side-by-side terminals. At POSITION 6, both wires are terminated by inserter 170. From POSITION 6, both wires are fed as the X-Y table moves, the tooling rotates to the 180° position, and inserter 175 is positioned to insert both wires into side-by-side terminals in a card edge connector 30 as it shears them (FIG. 7).

Figure 15A:
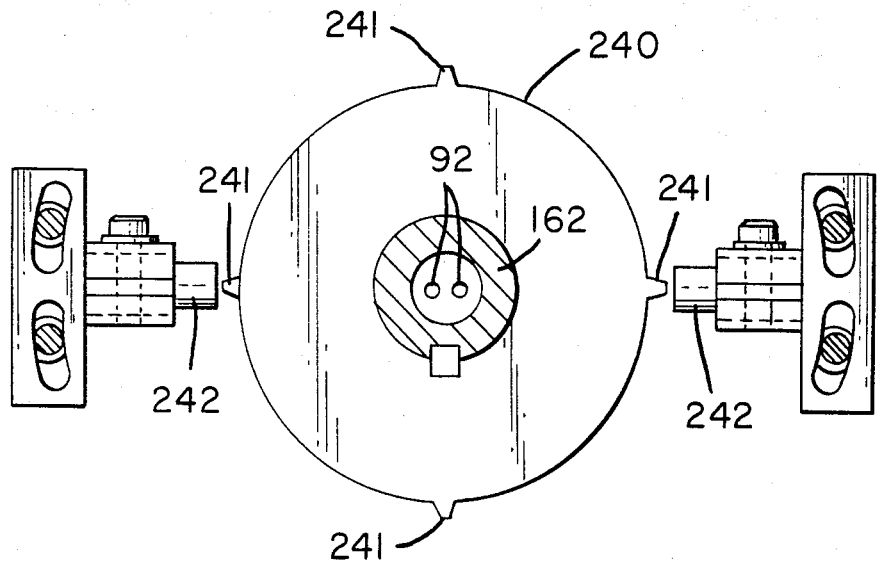
FIG. 15A is a top section view of the rotation sensor.
Figure 15B:
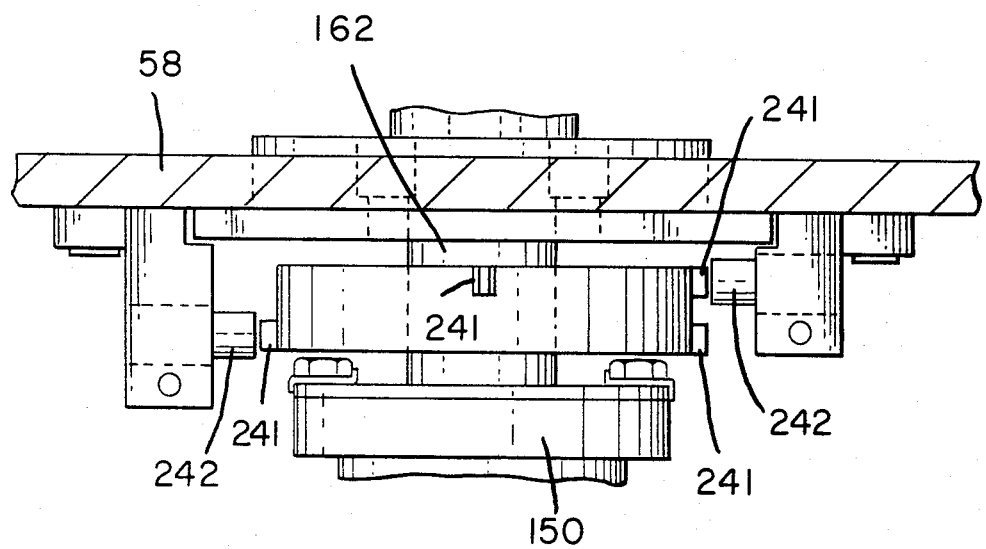
FIG. 15B is a side section view of the rotation sensor.

FIG. 15A is a plan view of the rotation sensor 240 mounted on tubular section 162 of center shaft 160 (see also FIG. 6). Switch vanes 241 located in four orthogonal orientations on two levels about the periphery of the sensor 240 provide feedback to the controller as to the angular position of the insertion tooling via switches 242. This is also shown in FIG. 15B, a side view showing the position of the sensor between upper plate 58 and the rotation housing 150.

The above description is exemplary and not intended to limit the scope of the claims which follow.

We claim:

1. Apparatus for electrically connecting first and second spaced apart terminals which are fixed relative to a planar substrate, each terminal comprising a plate-like member having a wire receiving slot extending toward said substrate, said slots in said plate-like members being substantially linear, substantially parallel to each other, and substantially perpendicular to the plane of said substrate, said apparatus comprising:
   an X-Y table on which said substrate is fixed, said X-Y table having independently operable X-axis and Y-axis moving means for moving said substrate in the plane thereof,
   wire feed means for feeding wire from a substantially endless source toward said substrate,
   insertion means for inserting a portion of said wire into said slot, said insertion means comprising a wire inserter located adjacent said substrate, said inserter being movable perpendicularly relative to said substrate, said insertion means being rotatable about an axis perpendicular to the plane of said substrate, said insertion means further comprising a rotation housing having a circular cam track thereon which is concentric to the axis of rotation, said track having a follower therein which moves perpendicularly relative to said board, said housing moving perpendicularly relative to said board to effect like movement of said inserter regardless of the angular position of the insertion means, control means for coordinating the feeding of wire toward said substrate, the rotation of said insertion means, and the movement of said X-Y table, whereby, first and second terminals having plate-like members at an angle relative to each other may be electrically connected by positioning a first portion of said wire against said slot in said plate-like member of said first terminal transverse to said plate-like member and inserting said first portion therein, subsequently moving said X-Y table, rotating said insertion means through a like angle, and feeding said wire so that a second portion thereof is against said slot in said plate-like member of said second terminal transverse to said plate-like member, then inserting said second portion therein.

2. An apparatus as in claim 1 wherein said wire feeding means feeds said wire substantially along said axis of rotation.

3. An apparatus as in claim 1 wherein said insertion means comprises a first pair of adjacent inserters, said feed means feeding a pair of adjacent wires, said control being effective to coordinate the positioning of an adjacent pair of terminals adjacent said pair of adjacent inserters, feeding an adjacent pair of wires, and moving said first inserters toward said terminals to insert said wires into said slots said first pair of adjacent inserters being first inserters having first shear means which cooperate with second shear means fixed relative to said substrate to shear said wires adjacent the terminals into which said portions of said wires are being inserted, said insertion means further comprising a second pair of inserters which are second inserters, said second inserters inserting said wire without shearing same, said first and second inserters being mounted for alternate use so that said insertion means is effective to move only one pair of said inserters toward the terminals into which portions of wire are being inserted.

4. An apparatus as in claim 1 wherein said inserter cooperates with shear means fixed relative to said substrate to shear said wire adjacent the terminal into which a portion of wire is being inserted.

5. An apparatus as in claim 1 wherein said insertion means comprises a first inserter having first shear means which cooperate with said second shear means fixed relative to said substrate to shear said wire adjacent the terminal into which a portion of said wire is being inserted, and a second inserter which inserts said wire without shearing same, said first and second inserters being mounted for alternate use so that said insertion means is effective to move only one of said inserters toward the terminal into which a portion of wire is being inserted.

6. An apparatus as in claim 5 wherein said insertion means further comprises shifting means for reciprocable shifting of said inserters transverse to the direction of movement toward said substate, said shifting means being effective to position only one of said inserters adjacent the terminal into which a portion of wire is being inserted.

7. An apparatus as in claim 3 wherein said insertion means further comprises shifting means for reciprocable shifting of said pairs of inserters transverse to the direction of movement toward said substrate, said shifting means being effective to position only one of said pairs of inserters adjacent the terminals into which said portions of wires are being inserted.

8. An apparatus as in claim 1 which further comprises a second follower in said circular track opposite said first follower, said followers being movable in unison.

9. An apparatus as in claim 1 which further comprises a yoke pivoted at one end and driven reciprocably with respect to the substrate at the other end, said follower being carried on said yoke intermediate said ends.

10. An apparatus as in claim 9 wherein said one end of said yoke is of variable distance with respect to said substrate, whereby varying said distance varies the limits of travel of said inserter relative to said substrate so that depth of wire insertion in a slot may be varied, whereby two wires may be inserted in a given slot.

* * * * *